United States Patent [19]

Friedman et al.

[11] Patent Number: 5,150,051
[45] Date of Patent: Sep. 22, 1992

[54] HOME GAUSSMETER WITH FILTER-INTEGRATOR CIRCUIT FOR MEASURING ELF RADIATION

[75] Inventors: Michael Friedman, Raymond; Owen Harrington; David Dunn, both of Windham, all of N.H.

[73] Assignee: Memtec Corporation, Salem, N.H.

[21] Appl. No.: 683,994

[22] Filed: Apr. 11, 1991

[51] Int. Cl.⁵ .................... G01R 33/02; G01R 29/08; G01R 15/10
[52] U.S. Cl. .................... 324/258; 324/72; 324/96; 324/115; 324/122; 324/132; 324/225; 340/600
[58] Field of Search .................. 324/67, 72, 95, 96, 324/103 D, 115, 122, 126–128, 132, 133, 225, 244, 247, 258, 260, 326, 345; 340/547, 551, 600

[56] References Cited

U.S. PATENT DOCUMENTS

| | | | |
|---|---|---|---|
| 4,634,969 | 1/1987 | Edlin et al. | 340/600 X |
| 4,691,165 | 9/1987 | Szedlmajer | 324/326 |
| 4,803,421 | 2/1989 | Ostrander | 324/72 |
| 4,837,489 | 6/1989 | McFee | 324/345 X |
| 4,914,382 | 4/1990 | Douville et al. | 324/127 |

Primary Examiner—Gerard R. Strecker
Attorney, Agent, or Firm—Cesari & McKenna

[57] ABSTRACT

A meter (10) for measuring extremely-low-frequency radiation includes a coil circuit (22) whose output is filtered by a sharp-cut-off high-pass filter (24) to pass standard house-current frequencies but suppress the frequency components that would predominate as a result of movement of the meter with respect to the earth's magnetic field. An integrator (26) compensates for the frequency response of the coil circuit (22), an RMS circuit (35) converts the signal to its root-mean-square value, and a display circuit (28) provides a display determined by the resultant signal.

4 Claims, 5 Drawing Sheets

HOME GAUSSMETER WITH FILTER-INTEGRATOR CIRCUIT FOR MEASURING ELF RADIATION

BACKGROUND OF THE INVENTION

The present invention is directed to measurement of extremely-low-frequency (ELF) radiation. It finds particular, although not exclusive, use in home measurement of such radiation.

Recent studies appear to indicate that exposure to ELF radiation of sufficient intensity can have adverse health effects. It is accordingly desirable to be able to measure the intensity of such radiation in the home and office.

Traditionally, measurements of ELF radiation have been made with laboratory gaussmeters, which tend to be heavy and expensive and generally inappropriate for use by the layman attempting to gauge the level of his exposure to such radiation. Home use by a layman requires that the measurement device be both simple to use and inexpensive. But meeting these simultaneous requirements is complicated by the fact that the radiation to be measured tends to be highly directional, varies greatly in magnitude, and comprises magnetic fields whose intensities are orders of magnitude below that of the earth's. These factors together conspire to deprive the average homeowner of the ability to make his own determination of his exposure to ELF radiation.

SUMMARY OF THE INVENTION

We have recognized that a device that is light, simple, and inexpensive enough for home use can be provided in an apparatus that employs a coil for detecting the ELF radiation and applies the resultant output voltage to signal-processing circuitry that both integrates it and subjects it to sharp-cut-off high-pass filtering having a cut-off frequency below the common 60-Hz house-current frequency and an attenuation at 10 Hz at least 20 db greater than that at 60 Hz. If the resultant output (or, say, its RMS value) is applied to a magnitude-indicating display, it can provide, with sufficient accuracy for home use, an indication of whether the ELF-radiation intensity is near the levels that have raised concerns. By using the sharp-cut-off high-pass filter, we eliminate the effects that movement of the coil with respect to the earth's magnetic field can cause on the measurement. Use of the integrator compensates for the frequency response of the coil so that meter's overall frequency response is essentially flat.

Such an arrangement can be embodied in a device that is both inexpensive and simple to use.

BRIEF DESCRIPTION OF THE DRAWINGS

These and further features and advantages of the present invention are described in connection with the accompanying drawings, in which.

DETAILED DESCRIPTION OF ILLUSTRATIVE EMBODIMENTS

Figure 1:
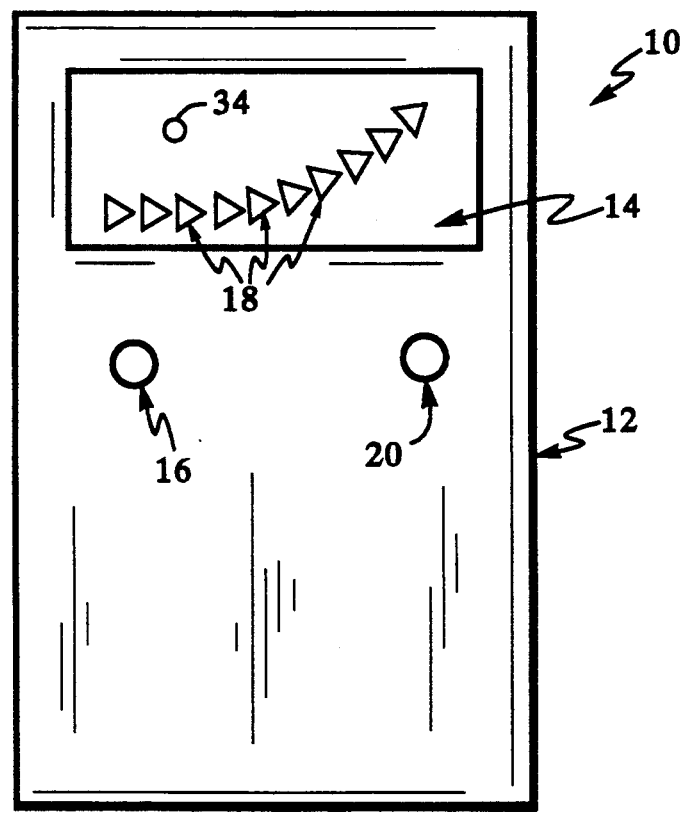
FIG. 1 is a front elevational view of a meter that embodies the teachings of the present invention.

FIG. 1 depict s a meter 10 that includes a case 12 inside which is mounted a rectangularly wound coil not shown in the drawings. In one version, we have used a 2.0 in. × 1.5 in. (5.1 cm. × 13.8 cm.) coil comprising 900 turns of #32 gage wire. ELF radiation induces an electromotive force in the coil, which is detected in a manner to be described below. The resulting signal is processed to yield an output rendered on a display 14.

To operate the meter, the user depresses one of two front panel buttons 16 and 20 for low and high ranges, respectively. A plurality of arrow-shaped LEDs 18 lights up as a result to indicate the detected radiation intensity. In the simplest version of the meter, the resultant reading depends on the orientation in which the user holds the meter, which can be embodied in a package whose case 12 fits in the palm of one's hand. The user adjusts the meter's orientation until he has maximized the meter output, and the resultant reading is a measurement of the exposure level. The user may also need to change the meter scale by depressing the alternate front panel button 16 or 20.

The display 14 is particularly well suited to this type of operation. During the orientation adjustment, the reading varies constantly, and we have found that a digital display is not easy to use in such a situation. On the other hand, the typical analog output, with a moving needle, can produce a deceptive output because some of the needle movement may be a result of the response of the needle's inertia to the meter's motion. Applicants have avoided these problems by providing a "moving-arrow" display, which is a display of discrete electronic devices that present the information in a quantized analog manner. The use of non-moving electronic devices avoids the inertia problem, while the display of the information in an analog manner makes it easy for the user to read the display while he is attempting to achieve the proper meter orientation.

A further help in this regard is the fact that the display renders the information on a logarithmic scale. If the meter is held with the coil axis nearly orthogonal to the direction of the magnetic field, the output can be low even though the actual intensity is relatively high. With a linear scale, therefore, a user could have trouble determining whether a small movement of an orthogonally oriented meter in a given direction increased or decreased the meter output. With the logarithmic display, however, the system is in effect more sensitive at the lower end of the scale, so the user can more readily determine whether movements to align the meter with the field are in the proper direction. In the illustrated embodiment, the scale covers a nearly 30 db range, and operation of switch 16 or 20 changes the scale by a factor of 10 so as to provide another 20 db of range.

Figure 2:
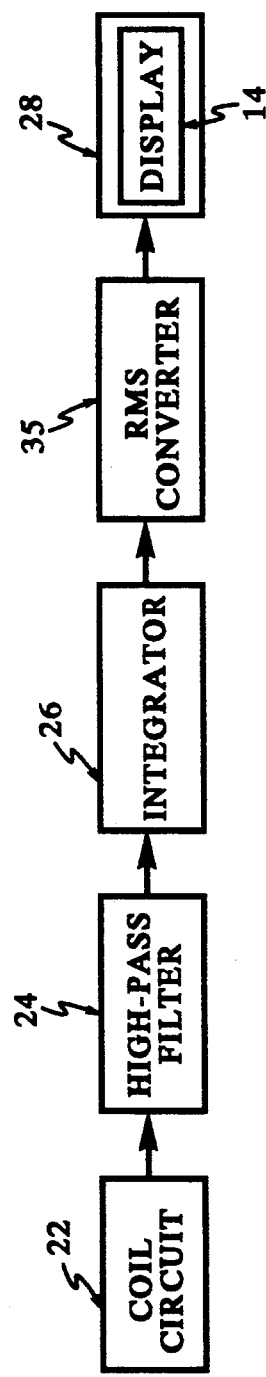
FIG. 2 presents a block-diagram rendition of the meter circuitry.

To implement these functions, the meter incorporates circuitry shown in block-diagram form in FIG. 2. The initial sensing occurs in a coil circuit 22, which, in the simplest version of the meter, includes only one coil. As was mentioned above, a single coil is orientation-sensitive, and it is necessary to orient the meter in the proper direction in order to obtain the proper reading. Because of the display features that Applicant provides, this procedure can be performed with a minimum of difficulty. Nonetheless, it does take some time, and other embodiments of the invention might instead provide three orthogonally oriented coils whose outputs are squared and added to obtain an indication of the radiation power. The square root of this value is an indication of the magnetic-field magnitude regardless of the meter orientation. With such an embodiment, no alignment of the meter with the field is necessary.

The output of the coil circuit is processed by circuitry shown conceptually in FIG. 2 as separate blocks 24 and 26, representing a high-pass filter and an integrator, although the two functions share common components in the illustrated embodiment. One version of the high-pass filter that we have used is a five-pole filter whose corner frequency is 30 Hz so that its gain at 10 Hz is about 45 db lower than its in-band gain. The user's movement of the meter within the earth's magnetic field might well result in components in the neighborhood of 10 Hz, and the high attenuation that the high-pass filter provides at these low frequencies eliminates the earth's magnetic field as a source of significant error. This is important because the radiation levels of concern are associated with magnetic fields whose intensities are more than two orders of magnitude below that of the earth's. Although the cutoff does not have to be quite that sharp, we believe that the 10 Hz gain in any practical version should be at least 20 db down if any movement of the meter is to be permitted at all.

Above the 30-Hz level, the response of the filter 24 is relatively flat, but that of the coil circuit 22 itself increases linearly with frequency. To compensate for this effect, Applicants have provided an integrator 26, whose response is inversely proportional to frequency within the pass band of the filter 24 so that the overall response of the circuitry at frequencies of interest is approximately flat. An RMS converter 35 derives the root-mean-square (RMS) amplitude of the integrator output. Use of the RMS converter allows accurate measurement of radiation having complex waveforms. Display circuitry 28 converts the resultant output to a form appropriate for driving the display 14.

For the three-coil version, the steps of squaring, summing, and taking the square root would typically be performed in the RMS converter circuit 35 or at any point in between if a parallel counterpart high-pass filter and/or integrator is provided in parallel for each of the coils.

Figure 3A:
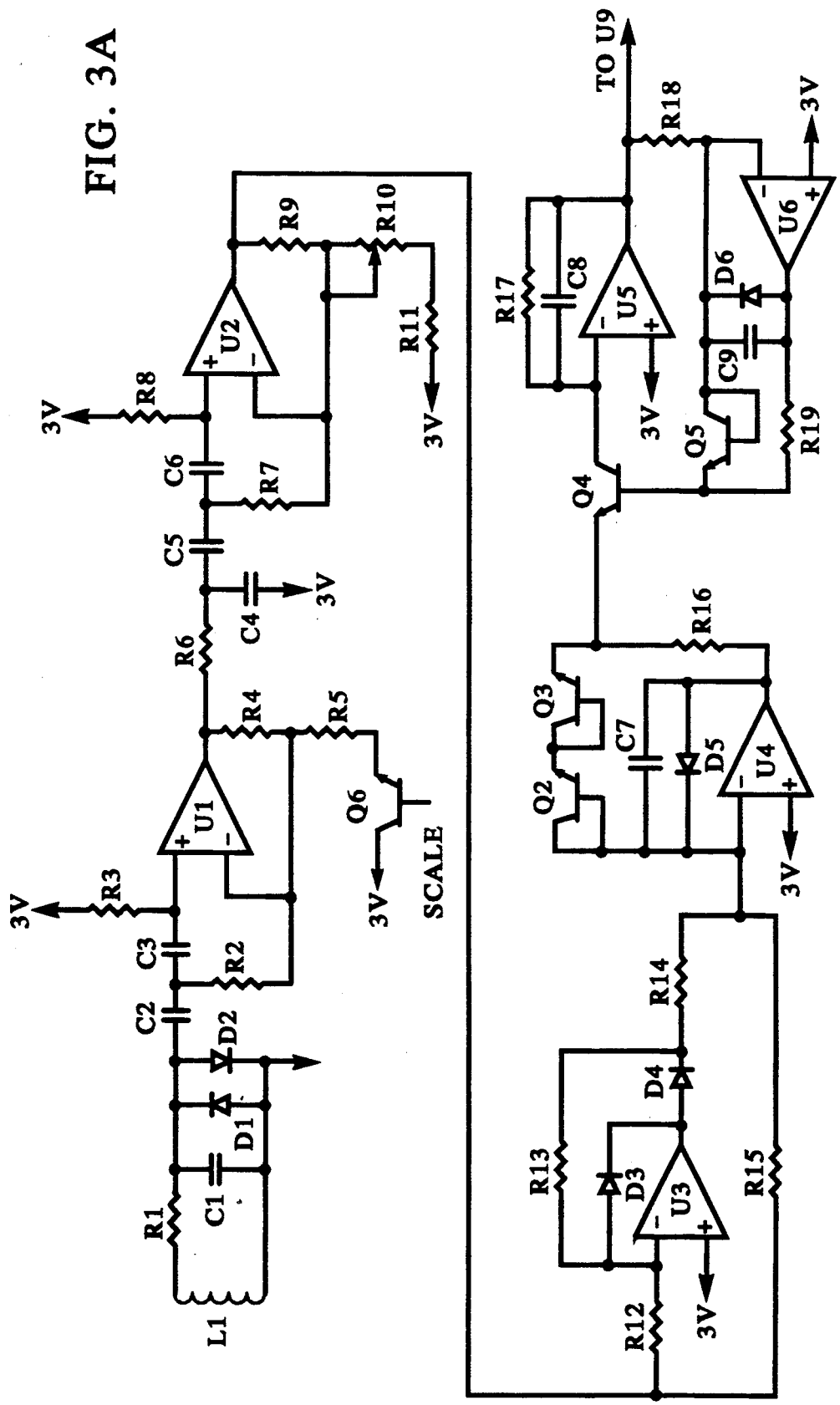
FIGS. 3A, B, and C together constitute a more-detailed, schematic-level diagram of the meter.
Figure 3B:
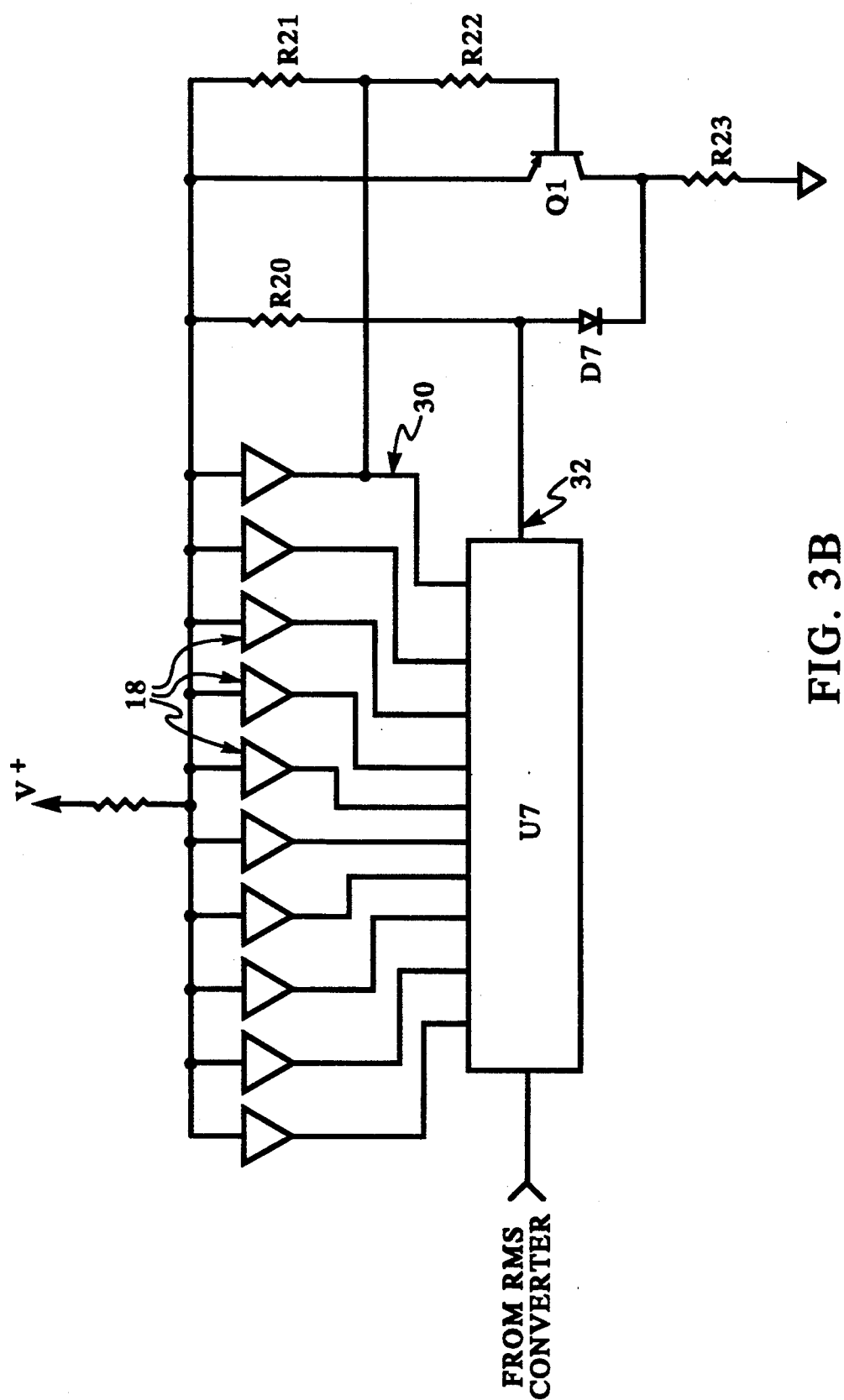
Figure 3C:
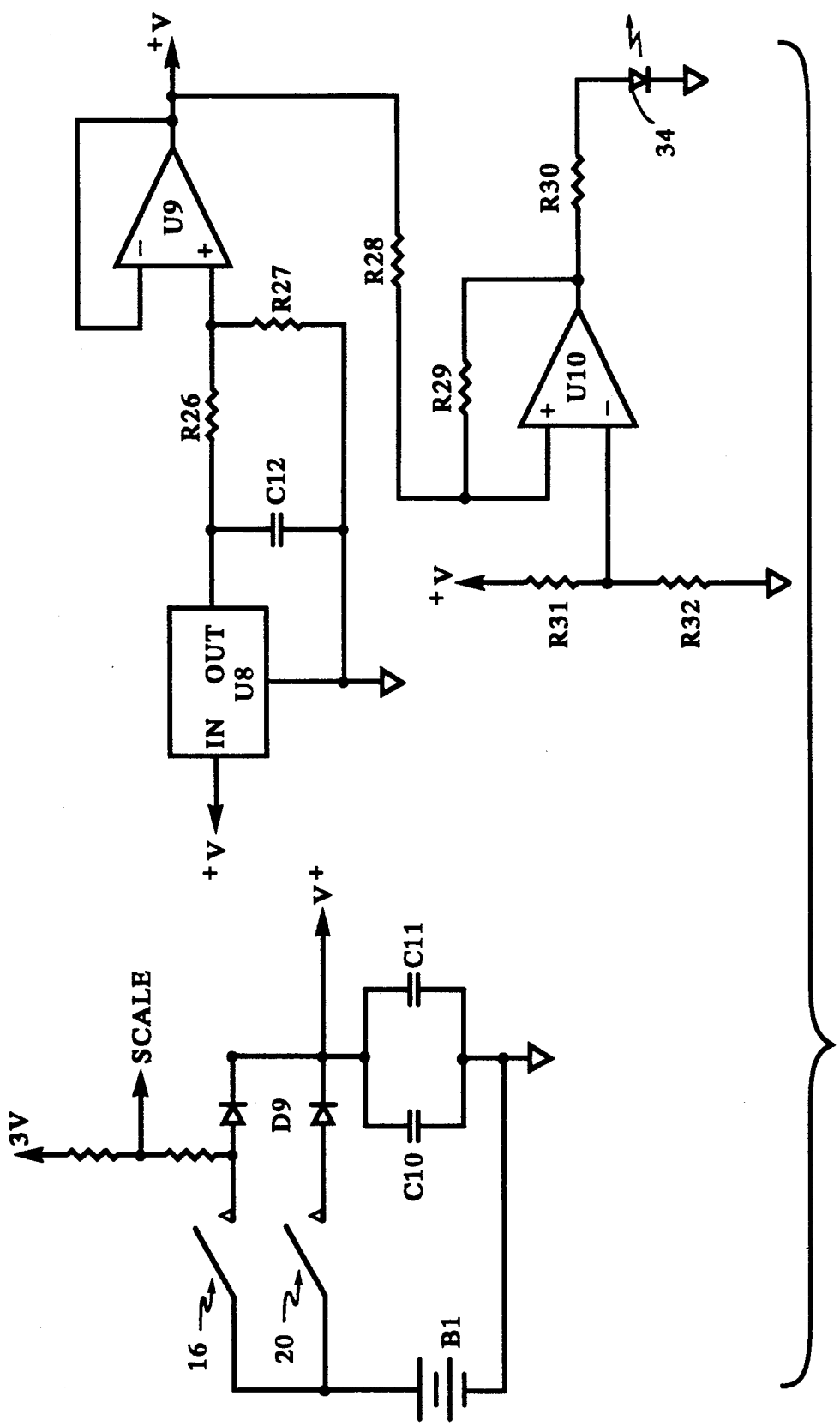

FIGS. 3A–3C together constitute a schematic diagram of one embodiment of the circuitry of FIG. 2. The coil circuit 22 includes a single coil L1 and a low-pass filter in the form of a resistor R1 and capacitor C1. The low-pass filter attenuates frequencies above around 4 kHz, which are beyond the range of interest.

Anti-parallel diodes D1 and D2 provide over-voltage protection to the high-pass-filter circuit 24. The high-pass-filter circuit 24 begins with a two-pole active filter circuit which includes differential amplifier U1, resistors R2 and R3, and capacitors C2 and C3. Also included in this stage is a voltage-dividing feedback network which includes resistors R4 and R5. In series with resistor R5 is transistor Q6, which, as will be explained below, is either turned on or cut off in accordance with the position of front-panel switch 16 (FIG. 1). Closure of the low-range switch 16 effectively returns R5 to +3 volts and results in an amplifier gain of 100. Opening switch 16 (and closing the high-range switch 20) yields an amplifier gain of 10.

Differential amplifier U1 applies its output to a three-pole active filter that includes a differential amplifier U2, resistors R6, R7, R8, R9, R10, and R11, and capacitors C4, C5, and C6. A resistor network composed of resistors R9, R10, and R11 determines the gain of this stage. Variable resistor R10 is used for factory adjustment of the overall circuit gain. The gain of this amplifier circuit is approximately 100. The transfer function of the serial combination of this filter with the two-pole filter is the product of those of an ideal integrator and a five-pole active Butterworth filter that has a corner frequency of 30 Hz.

Figure 4:
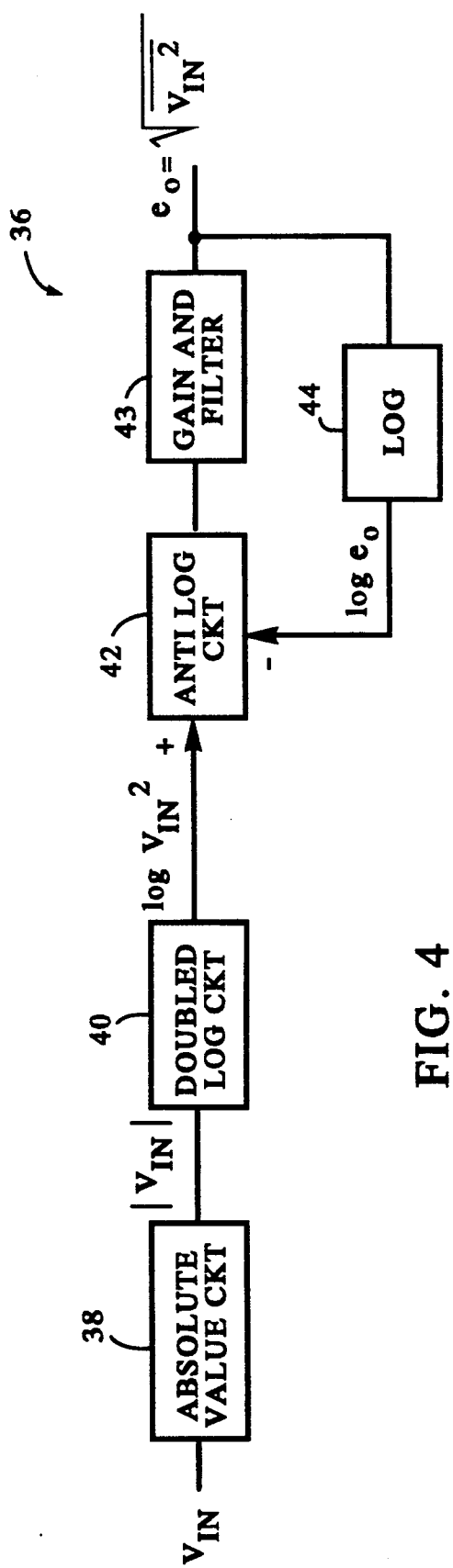
FIG. 4 is a block diagram of the RMS convertor of FIG. 2.

Amplifier U2 applies its output to an RMS converter comprising the remaining circuitry of FIG. 3A. FIG. 4 depicts this circuitry in block-diagram form, showing that it includes an absolute-value circuit 38, whose output current is proportional to the absolute value of the difference, $V_{in}$, between the instantaneous U2 output voltage and the +3-volt reference. A logarithm circuit 40 produces an output voltage proportional to the logarithm of the absolute-value-circuit output current. Since log $x^2 = 2$ log x, the output of log circuit 40 can also be thought of as being proportional to the logarithm of $V_{in}^2$, and it will be convenient to do so, because the output of logarithm circuit 40 is received by an antilogarithm (exponential) circuit 42 whose proportionality constant is half that of the logarithm circuit 40 so that a squared relationship between the log-circuit input and the antilog-circuit output. More precisely, the antilogarithm circuit 42 is provided with an averaging filter 43 so that, if the inverted input to the antilogarithm circuit 42 remained constant, the antilogarithm circuit output would be proportional to $\overline{V_{in}^2}$, i.e., to the mean value of $V_{in}^2$.

However, antilog circuit 42 receives a non-constant feedback value at its inverting input port; a logarithm circuit 44 applies as the inverted input a voltage proportional to the logarithm of the RMS-circuit Output $e_o$. Consequently, the output of antilog circuit 42 is proportional to the antilog of the difference between the logarithm of $V_{in}^2$ and $e_o$. The output $e_o$, in turn, is the average of this output. Therefore, $$e_o = K \overline{\text{antilog} (\log V_{in}^2 - \log e_o)},$$

or $$e_o = \overline{K(V_{in}^2)/e_o}.$$

Since $e_o$ is the filter output, $$\overline{(V_{in}^2)/e_o} = \overline{V_{in}^2}/e_o,$$

so $$e_o = K(\overline{V_{in}^2})^{\frac{1}{2}},$$

where K is a proportionality constant.

The absolute-value circuit 38 includes amplifier U3, diodes D3 and D4, and gain resistors R12, R13, R14, and R15 of FIG. 3A. This circuit provides "positive" output current regardless of the "polarity" of its input, i.e., regardless of whether that input is more or less than the +3-volt reference level.

Amplifier U3 is wired in a negative-feedback arrangement so that its output port draws or drives enough current through its input resistor R12 to make the voltage at its inverting input port nearly equal to the 3-volt value at its non-inverting input port regardless of the input voltage that amplifier U2 applies to resistor R12. When the U2 output is "positive" (i.e., greater than the 3-volt reference), no current flows into or out of the U4 summing junction through R14, because diode D4 is back-biased and there is no potential difference between the U3 and U4 inverting input ports that can cause current flow in the R13–R14 path. The current that flows into the summing junction is thus proportional, in accordance with the value of resistor R15, to the difference between the U2 output and the 3-volt reference.

When the input is "negative," on the other hand, current flows in the other direction from the U4 summing junction through R15, but feedback for U3 occurs through diode D4 rather than D3, and the relative values of resistors R12, R13, R14, and R15 are such that the resultant current flowing into the junction through R14 is twice that out of the junction through R15. Therefore, the net of these two currents is proportional to the input with a proportionality constant the negative of that which prevails when the input is positive.

This net current, proportional to the absolute value of $V_{in}$, is applied to the summing junction of the "double" logarithm amplifier. Amplifier U4, logging transistors Q2 and Q3, compensation network R16 and C7, and protection diode D5 generate the doubled logarithm function. Since the base-to-emitter voltage of these transistors is logarithmically related to their collector currents, the output of this amplifier is proportional to $\log |V_{in}|$ and thus to $\log (V^2_{in})$.

This logarithmic voltage is impressed on a single antilogarithm transistor Q4 to yield a Q4 collector current that would be proportional to $V^2_{in}$ if the Q4 base voltage (which corresponds to the non-inverted input to the antilogarithm circuit 42 of FIG. 4) were kept at an appropriate constant value. This current is drawn from the summing junction of amplifier U5, whose gain is determined by resistor R17. Amplifier capacitor C8 provides the filtering represented by block 43 of FIG. 4, and a mean-squared output results. The logarithm of this output, generated by differential amplifier U6, logorithm transistor Q5, compensation components R19 and C9, and protection diode D6, is fed back to the antilogarithm transistor Q4 to provide continuous division by a divisor proportional to the output signal $e_o$, as was explained before in connection with FIG. 4.

In order to provide an output which requires no calibration, transistors Q2 and Q5 are matched, as are transistors Q3 and Q4.

The RMS-converter output is applied to a logarithmic-scale LED driver U7 (FIG. 3B), which may be an LM3915 Dot Display Driver manufactured by National Semiconductor Corporation of Santa Clara, Calif. Driver U7 drives the LEDs 18 in the previously described manner, illuminating the LED whose position represents the magnitude of the U7 input. When the input reaches the top of the scale, as represented by the driving of the end-of-scale LED, the resultant low output on line 30 turns on transistor Q1 through resistor R22. Transistor Q1, which was previously held in its off state by the high signal applied to it through resistors R21 and R22, accordingly conducts current through resistor R23, thereby back-biasing diode D7 and stopping the current that previously flowed through resistor R20 to apply a low level to mode input port 32. The input at the port 32 accordingly goes high, and the driver circuit U7 switches into a mode in which, when the highest-level LED is being driven, it drives all of the other LEDs, too. In this way the user is alerted to the fact that the input has likely gone off the scale. The user then would typically switch to the higher scale by operating switch 20.

To take a reading, the user operates momentary switch 16 or 20, which, as FIG. 3C shows, connects a battery B1 through diode D8 or D9 to the amplifiers' power rail (V+), across AC bypass capacitors C10 and C11, and across a 5-volt regulator U8 whose output is applied across a filter capacitor C12. A voltage divider comprising resistors R26 and R27 steps the 5-volt regulator output down to 3 volts, which is applied to the non-inverting input port of a differential amplifier U9. This amplifier is wired for unity gain to provide the 3-volt reference level employed at various points in the previously described circuitry.

The 3-volt output of amplifier U9 is fed through a low-resistance resistor R28 to the non-inverting input port of an LED-driver differential amplifier U10. The other input port of U10 receives the output of a voltage divider R31, R32 whose output is a little less than 4 volts when the battery output is its nominal 9 volts. At this normal level, differential amplifier U10's inverting input port receives a higher input than its non-inverting input port, so amplifier U10 does not drive the LED 34 that presents the low-battery indication. But the output of amplifier U10 goes to a high level if the battery voltage falls to the point at which the voltage-divider output is less than 3 volts by enough to overcome the hysteresis that results from positive feedback through resistor R29. The result is that amplifier U10 drives LED 34 through a current-limiting resistor R30 to indicate that the battery should be replaced.

From the foregoing description, it is apparent that Applicants' invention can be embodied in an inexpensive, easy-to-sue meter. The present invention thus represents a significant advance in the art.

We claim:

1. A meter for measuring extremely-low-frequency electromagnetic fields comprising:
   A) a coil that produces a coil voltage in response to varying magnetic fields;
   B) a filter-integrator circuit connected to receive the coil voltage as its input and having as its transfer function the product of those of a high-pass filter and an integrator, the high-pass filter having a cut-off frequency below 60 Hz and an attenuation at 10 Hz at least 20 db greater than its attenuation at 60 Hz; and
   C) a display circuit responsive to the output of the filter-integrator circuit for generating a visual indication thereof.

2. A meter as defined in claim 1 wherein the display circuit includes discrete display devices on which it generates a visual indication in an analog form.

3. A meter as defined in claim 2 wherein the spacing of the devices in the discrete-device analog display is substantially logarithmic.

4. A meter as defined in claim 1 further including an RMS circuit interposed between the filter-integration circuit and the display circuit so as to apply to the display circuit an RMS output representative of the root-mean-square value of the output of the filter-integrator circuit.

* * * * *